United States Patent [19]

Iwabuchi et al.

[11] Patent Number: 5,407,350
[45] Date of Patent: Apr. 18, 1995

[54] HEAT-TREATMENT APPARATUS

[75] Inventors: Katsuhiko Iwabuchi, Tokyo; Takeo Suzuki, Kitakyushu; Takashi Tozawa, Tokyo; Satoshi Kagatsume, Tokyo; Hirotsugu Shiraiwa, Tokyo, all of Japan

[73] Assignees: Tokyo Electron Limited, Tokyo; Tokyo Electron Sagami Limited, Kanagawa; Kabushiki Kaisha Yaskawa Denki, Kitakyushu, all of Japan

[21] Appl. No.: 17,378

[22] Filed: Feb. 12, 1993

[30] Foreign Application Priority Data

| Feb. 13, 1992 | [JP] | Japan | 4-059524 |
| Feb. 13, 1992 | [JP] | Japan | 4-059525 |
| Feb. 13, 1992 | [JP] | Japan | 4-059526 |
| Feb. 26, 1992 | [JP] | Japan | 4-076295 |

[51] Int. Cl.$^6$ .................................. F27D 3/12
[52] U.S. Cl. ........................ 434/241; 432/156; 432/11; 432/253
[58] Field of Search .............. 432/241, 156.11, 253, 432/5.6

[56] References Cited

U.S. PATENT DOCUMENTS

| 5,116,784 | 5/1992 | Ushikawa | 437/225 |
| 5,207,578 | 5/1993 | Sakata | 432/241 |
| 5,271,732 | 12/1993 | Yokokawa | 432/5 |
| 5,273,423 | 12/1993 | Shiraiwa | 432/152 |

Primary Examiner—Henry C. Yuen
Attorney, Agent, or Firm—Oblon, Spivak, McClelland, Maier & Neustadt

[57] ABSTRACT

A heat-treatment apparatus comprises a heat-treatment section for subjecting a heat-treatment to a wafer and a loading section for loading a wafer boat into and unloading it from the heat-treatment section. The loading section is connected to the heat-treatment section and includes in it a movable support member, a drive mechanism and a vertical base board as well as a load-lock chamber for maintaining the inside in vacuum. The movable support member supports a wafer boat. The movable support member is attached to a vertical base board so that it can move up and down. The drive mechanism is attached on the major surface of the vertical base board opposite to the surface facing the wafer boat. The drive mechanism drives the movable support to move up and down. The heat-treatment apparatus further comprises a wafer transfer section that includes an orientation flat alignment mechanism and a buffer stage disposed near the orientation flat alignment mechanism. The wafer transfer section includes a wafer cassette means, a buffer stage and a wafer transfer robot for transferring wafers between the orientation flat alignment mechanism and the wafer boat.

9 Claims, 9 Drawing Sheets

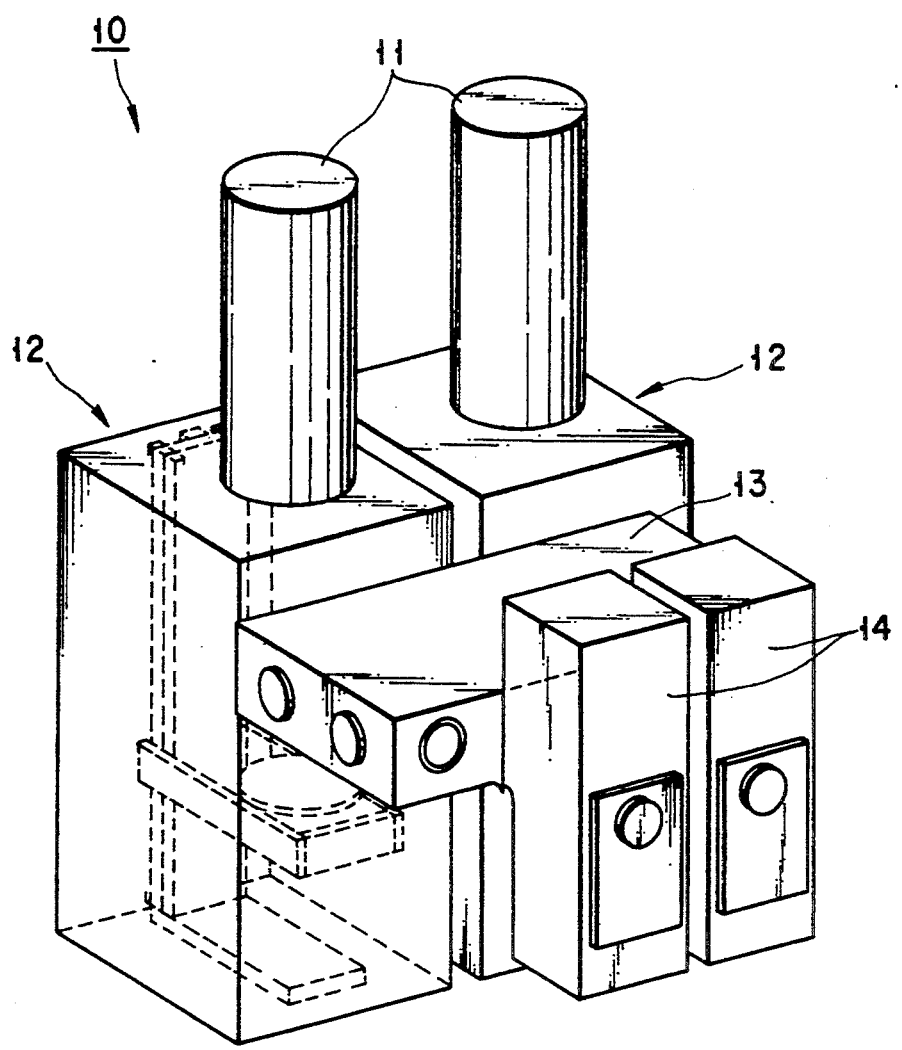
F I G. 1

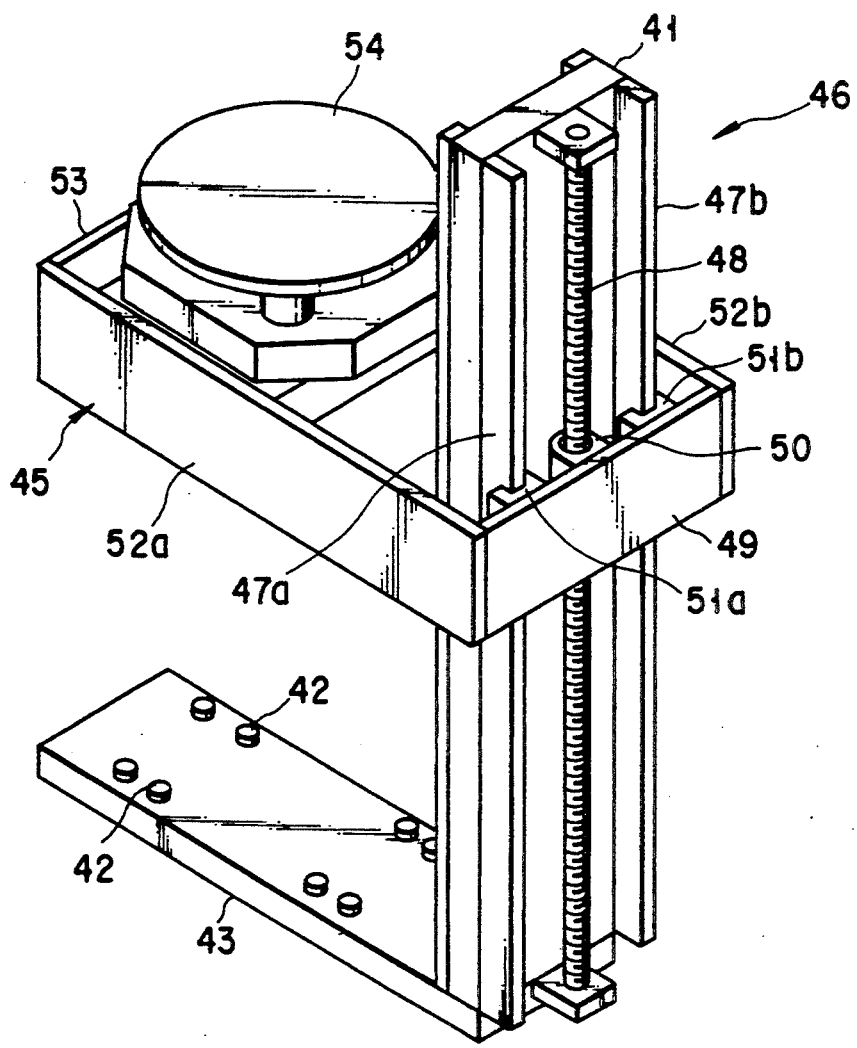
F I G. 4
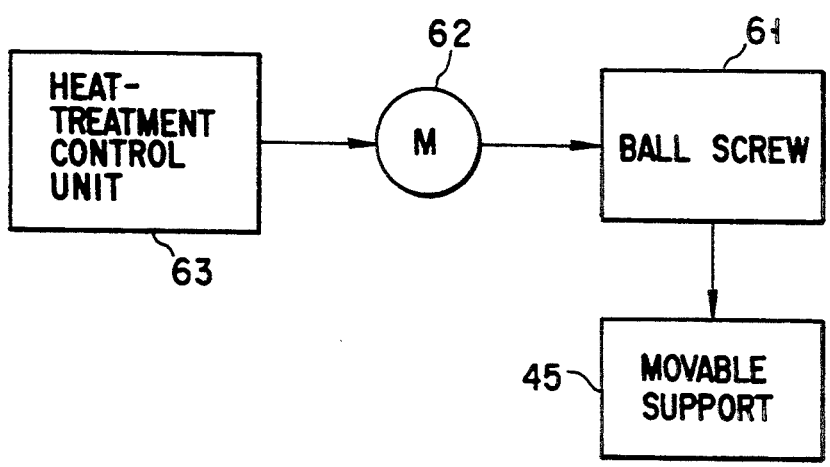
F I G. 5

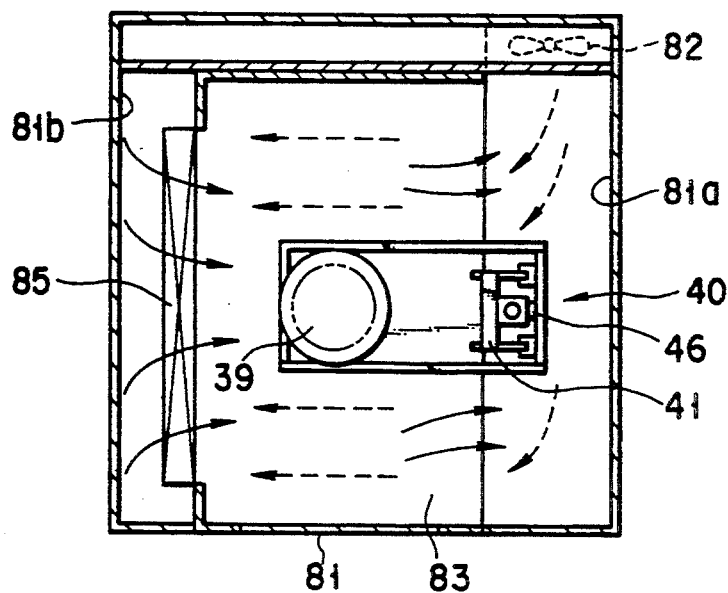
F I G. 9
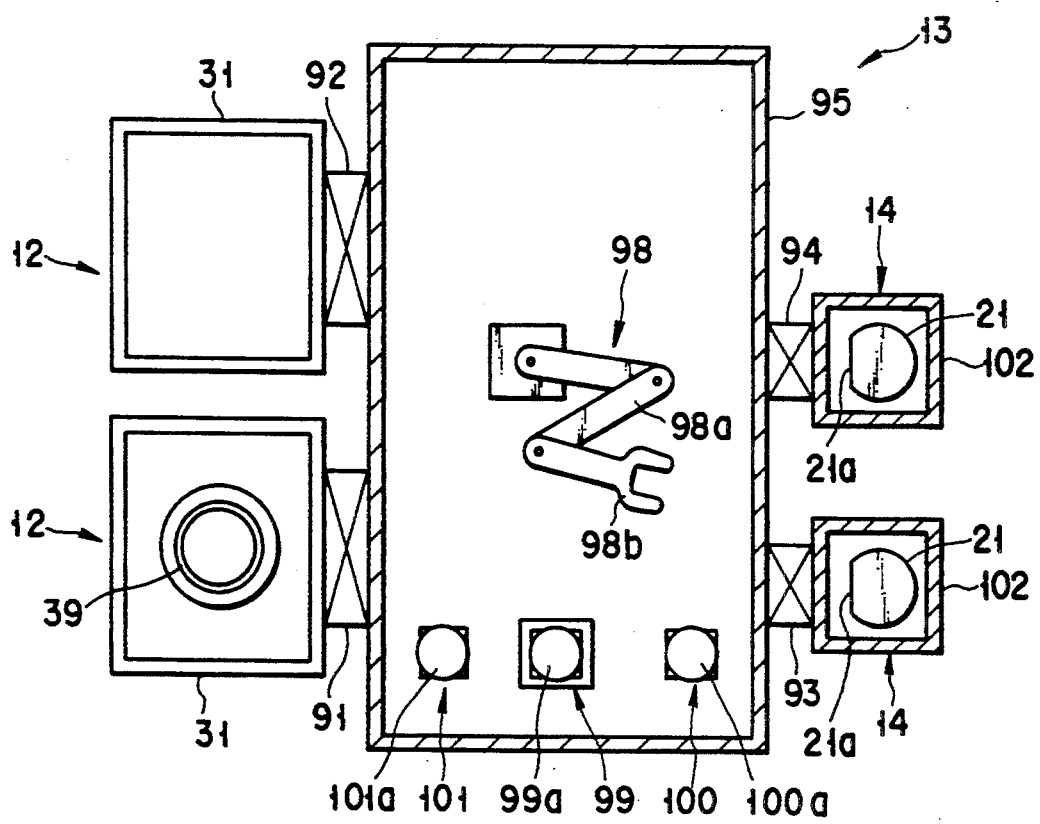
F I G 10

HEAT-TREATMENT APPARATUS

BACKGROUND OF THE INVENTION

1. Field of the Invention

This invention relates to a heat-treatment apparatus to be used for various heat-treatment processes conducted on an object of heat-treatment such as a semiconductor wafer.

2. Description of the Related Art

A heat-treatment apparatus is typically used for various heat-treatments of semiconductor wafers including those of forming an oxide film on the surface of the wafer, forming a thin film over the surface of the wafer by CVD method and producing an impurity-dispersed region on the wafer by a thermal dispersion method. A typical known heat-treatment apparatus comprises a heat-treatment section for subjecting the heat-treatment to semiconductor wafers in a predetermined manner and a loading section through which a wafer boat containing a plurality of the semiconductor wafers is loaded into and unloaded from the heat-treatment section. A vertical type heat-treatment apparatus is popular. In the vertical type heat-treatment apparatus, the loading section is normally disposed under the heat-treatment section and the wafer boat is moved up and down vertically in the loading section.

The heat-treatment section comprises a process tube made of a heat resistant material such as quartz, a heater disposed around the process tube for heating the wafers and gas supply means for supplying process gas to the process tube. The wafer is heat treated at a predetermined temperature in a process gas atmosphere within the heat-treatment section.

The loading section comprises a support member for supporting the wafer boat and a drive mechanism for driving the support member to move to a direction of the loading/unloading the wafer boat. The drive mechanism is typically provided with a ball shaft which is arranged in the direction of loading/unloading the wafer boat and functions as a male screw of a ball screw. Onto the ball shaft, a ball nut formed at an end of the support member functioning as a female screw of the ball screw is connected to engage each other. An end of the ball shaft is connected to the drive shaft of the motor. With such an arrangement, the shaft is driven by the motor so that the support member is vertically moved as the ball shaft and the ball nut interact with each other. As a result, the wafer boat is loaded into or unloaded it from the process tube.

In recent years, a semiconductor device tended to be highly integrated and hence sophisticated. In a manufacture of such a device, the yield of manufacturing of it is significantly reduced by fine particles that adhere to the surface of wafers during the heat-treatment process. Hence, wafers are required to be handled under very clean conditions.

However, the above described drive mechanism involves mechanical motions of some or most of its components, which are by turn inevitably subjected to wear. When, for example, the ball shaft and the ball nut are operated for relative movement, they are worn, if slightly, to produce fine particles that come off from the surfaces thereof. Hence, it is very important to protect the surface of the wafers in the wafer boat against such particles that may adhere to it.

The wafers and the wafer boat unloaded from the process tube normally show a temperature between approximately 150° and 250° C. This means that the drive mechanism receives radiation of heat from the wafers until they are sufficiently cooled by clean air and the radiated heat can deteriorate, if partly, a lubrication oil of the drive mechanism until particles of degraded oil are scattered around.

The loading section is, on the other hand, provided with a load-lock chamber. Any gas in the chamber can be evacuated to vacuum and the inside of the chamber can be purged with an appropriate gas such as nitrogen gas in order to prevent the heated surface of the wafers from being oxidized.

A heat-treatment apparatus is additionally provided with a wafer stocker section for temporarily storing wafers and a wafer transfer section for transferring wafers from the wafer cassette to the wafer boat. Wafers are moved from the wafer cassette to the wafer boat on a one by one basis or in batches of a given number of wafers. It is, however, extremely difficult for the mechanism of transferring wafers employed in the wafer transfer section to accurately align all the wafers on a wafer boat in terms of the orientation flats of the wafers. Therefore, when the wafers are subjected to the heat-treatment within the process tube, there can arise gas turbulences in it, making the condition surrounding the surfaces of the wafers in the tube remarkably uneven and disadvantageous for heat-treatment and reducing significantly the yield of manufacturing wafers in such an apparatus.

The wafer loading robot of the wafer loading section can also be adversely affected to eventually go out of function by the heat radiated from the heat-treatment section of the apparatus. In an attempt to prevent any such malfunction of the robot, a robot chamber is normally provided in the wafer loading section to contain a wafer transferring mechanism such as the robot, and equipped with gate valves which connect the robot chamber and the load-lock chamber or the wafer stocker section. The gate values are normally kept closed to block the heat radiated from the load lock chamber and is opened only when wafers are transferred from the wafer cassette to the wafer boat.

SUMMARY OF THE INVENTION

It is, therefore, an object of the present invention to provide a heat-treatment apparatus that effectively prevents particles produced in the drive mechanism of the apparatus from adhering to the surface of the object which is being subjected to the heat-treatment in the apparatus.

It is another object of the present invention to provide a heat-treatment apparatus that can accurately align all the semiconductor wafers transferred from a wafer cassette to a wafer boat in a relatively simple manner within a short period of time.

According to the invention, the above objects are achieved by providing a heat-treatment apparatus comprising a heat-treatment section for subjecting a heat-treatment to an object of treatment in a predetermined manner and a loading section for loading said object of treatment into and unloading it from said heat-treatment section, said loading section including a support member for supporting said object of treatment, a drive mechanism for loading said object of treatment into and unloading it from said heat-treatment section and a board member disposed between said supporting member and said drive mechanism to shield said drive mechanism against an area where said object of treatments is moved by the loading section.

According to the invention, the above objects are also achieved by providing a heat-treatment apparatus comprising a heat-treatment section for subjecting a heat-treatment to a plurality of wafers held on a wafer boat means, a loading section for loading said wafer boat means into and unloading it from said heat-treatment section, a wafer stocker section for storing wafers before or after the heat-treatment and a wafer transfer section for moving wafers between a wafer cassette means and a wafer boat means, said wafer transfer section including an orientation flat alignment mechanism for aligning the orientation flats of said plurality of wafers with a predetermined point, a buffer stage on which the wafers are temporarily placed before the alignment operation in the orientation flat alignment mechanism and a wafer transfer means for moving wafers relative to said wafer cassette means, buffer stage, orientation flat alignment mechanism and wafer boat means with predetermined timings.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic perspective view of a first embodiment of heat-treatment apparatus according to the invention;

FIG. 4 is a schematic perspective view of the boat elevator of the embodiment of heat-treatment apparatus of FIG. 1;

FIG. 5 is a schematic block diagram of the drive mechanism and the heat-treatment control section of the embodiment of heat-treatment apparatus of FIG. 1;

FIG. 9 is a horizontal sectional view of the modified loading section of FIG. 8;

FIG. 10 is a horizontal sectional view of the embodiment of heat-treatment apparatus of FIG. 1;

DETAILED DESCRIPTION OF THE PREFERRED EMBODIMENTS

Figure 2:
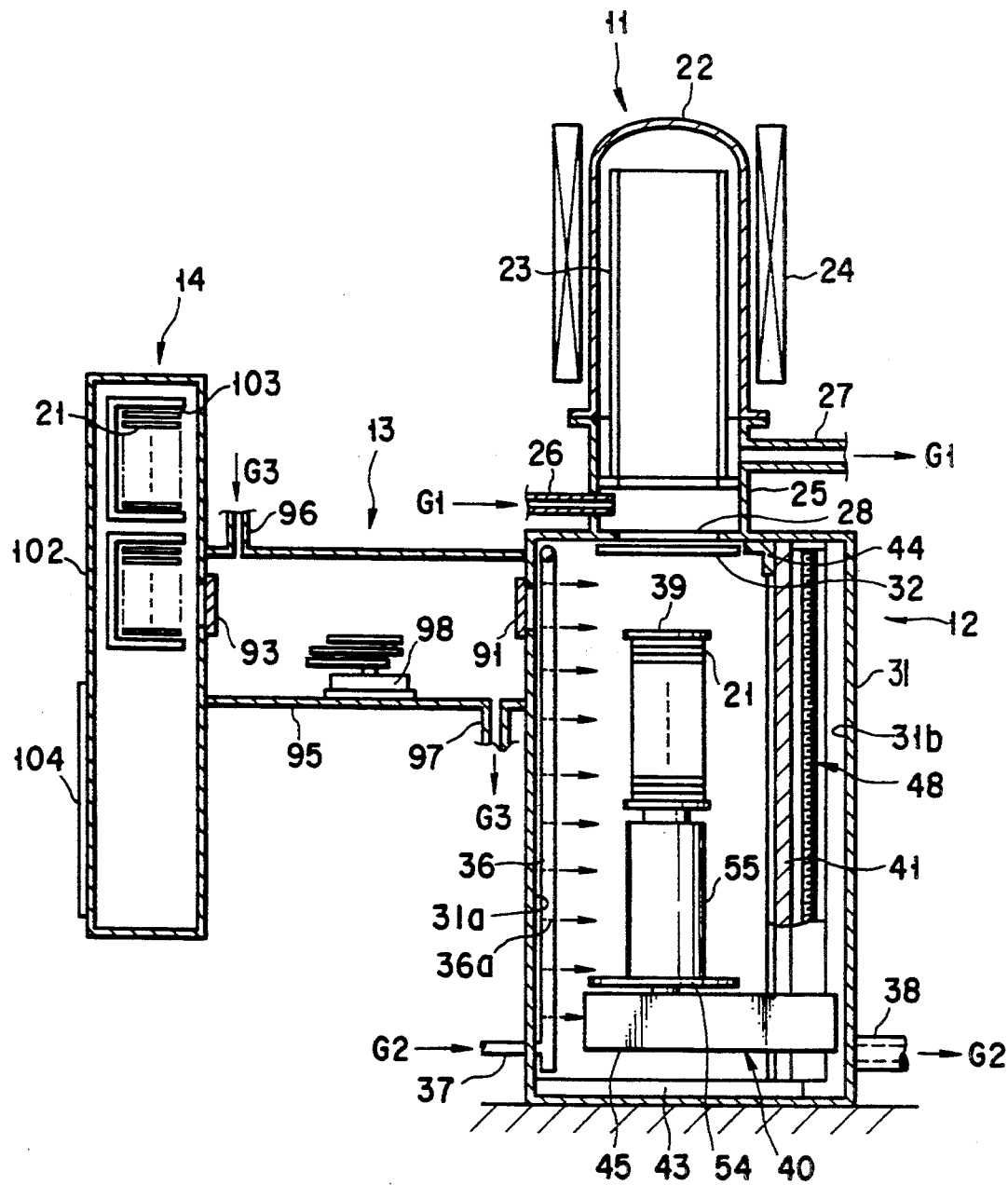
FIG. 2 is a vertical sectional view of the embodiment of heat-treatment apparatus of FIG. 1.

FIG. 1 is a schematic perspective view of a first embodiment of heat-treatment apparatus according to the invention. As seen from FIG. 1, the heat-treatment apparatus 10 comprises a heat-treatment section 11. A loading section 12 is disposed under the heat-treatment section 11. A wafer transfer section 13 and a wafer stocker section 14 are sequentially arranged next to the loading section 12. Now, these sections will be described in detail below.

As illustrated in FIG. 2, the heat-treatment section 11 comprises a process tube 22, where a heat-treatment is subjected to semiconductor wafers 21 as described below. The process tube 22 is substantially cylindrical and closed at an end thereof. It is made of a heat resistant material such as quartz that does not chemically and physically affect the semiconductor wafer. The process tube 22 by turn contains in it a hollow and substantially cylindrical partition wall 23 also made of a heat resistant material such as quartz. An electric heater 24 is arranged around the process tube 22 to heat the inside of the tube to a predetermined temperature. As will be hereinafter described, a heat-treatment control unit (FIG. 5, 63) is connected to the electric heater 24. This heat-treatment control unit can maintain the inside of the process tube 22 to a given heat-treatment temperature corresponding to a heat-treatment which will be conducted. For example, the heat-treatment temperature can be maintained between 500° and 1,000° C. for CVD and between 800° and 1,200° C. for oxidation treatment and diffusion treatment.

A substantially cylindrical manifold 25 is connected to the lower end of the process tube 22. A gas supply pipe 26 is connected to the lateral wall of the manifold 25 and process gas G1 is supplied to the inside of the process tube 22 through this pipe 26 and the manifold 25. The remote end of the gas supply pipe 26 is connected to a gas source via a control valve or the like. An exhaust pipe 27 is disposed at a position opposite to the gas supply pipe 26 on the lateral wall of the manifold 25. A vacuum pump (not shown) is connected to the remote end of the exhaust pipe 27. The process gas G1 that has been circulated in the process tube 22 and any air found in the process tube 22 before the start of a heat-treatment operation are forcedly evacuated from the process tube 22 through the manifold 25 and the exhaust pipe 27 by the vacuum pump. Gases used as process gas include $SiH_4$ in the case of forming a polysilicon film on the wafer and $NH_3$ and $SiH_2Cl_2$ in the case of forming a silicon nitride film on the wafer. $N_2$ gas is used for purging the inside of the process tube 22.

Figure 3:
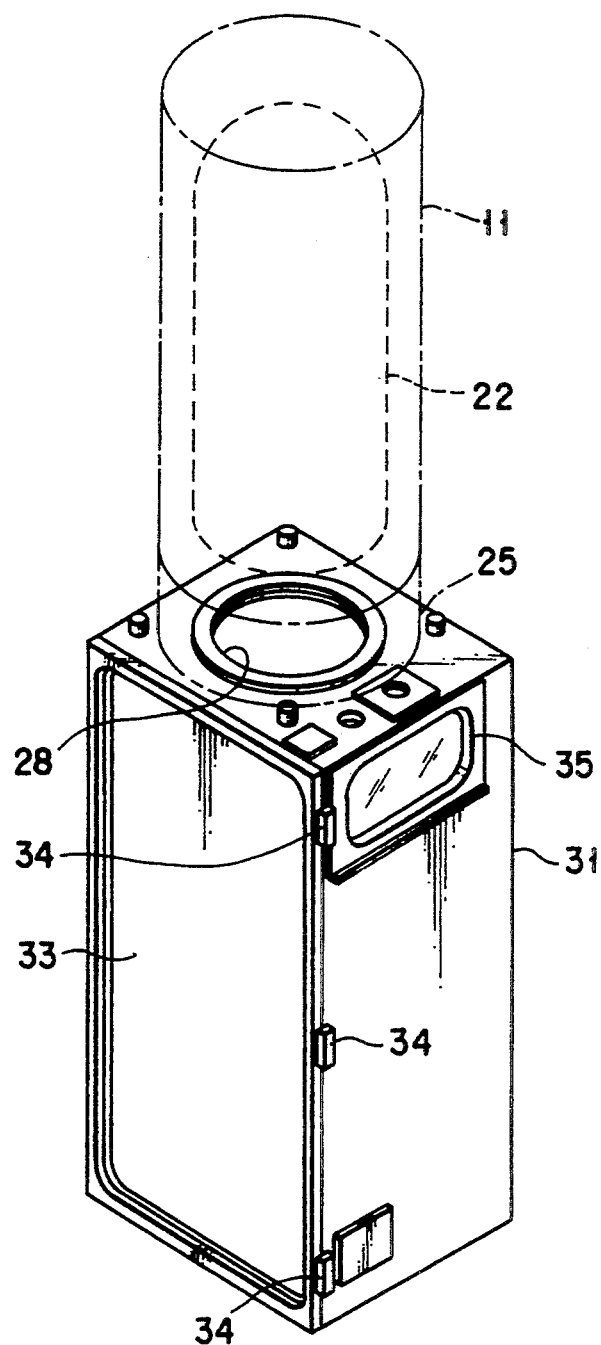
FIG. 3 is a schematic perspective view of the load lock chamber of the embodiment of heat-treatment apparatus of FIG. 1.

The loading section 12 comprises a load-lock chamber 31 which is held in communication with the process tube 22 by way of the manifold 25. The load-lock chamber 31 is provided with an opening 28 formed to face the manifold 25 and a shutter 32 to be used for opening or closing the opening 28. As illustrated in FIG. 3, the load-lock chamber 31 is provided on a lateral side thereof with a door that can be swung open by mean of hinges 34. The load-lock chamber 31 is provided on another lateral side thereof with a window 35 made of a transparent material, through which the inside of the load-lock chamber 31 is visible from outside.

A nozzle 36 is laid in the load-lock chamber 31 so that purge gas G2 such as $N_2$ gas can be supplied to the inside of the chamber 31 through the nozzle 36. The nozzle 36 is substantially U-shaped and arranged along the inner wall of the lateral side 31a of the chamber 31 facing the wafer transfer section 13 as will be hereinafter described. A number of air holes 36a for injecting purge gas G2 into the chamber 31 are formed through the peripheral wall of the nozzle 36 at regular intervals. The nozzle 36 is connected to a purge gas source (not shown) via a gas supply pipe 37. An exhaust pipe 38 is disposed through the lower end of the lateral side 31b of the chamber 31 which is located opposite to the lateral side 31a. A vacuum pump (not shown) is connected to the exhaust pipe 38.

The load-lock chamber 31 is also provided in the inside with a boat elevator 40 for moving up and down a wafer boat 39. As seen from FIG. 2, the boat elevator 40 comprises a plate-shaped vertical base board 41 separated by a given distance from the inner wall of the lateral side 31b which is opposite to the lateral side 31a. As illustrated in FIG. 4, the lower ends of the vertical base board 41 is securely and rigidly fixed to a horizontal base board 43 which is by turn secured to the bottom of the load-lock chamber 31 with bolts 42. The upper end of the vertical base board 41 is also rigidly and securely fixed to the inner wall of the ceiling of the load lock chamber 31 by means of L-shaped angle joints 44. The vertical base board 41 is typically made of stainless steel. A movable support 45 is movably attached to the vertical base board 41 and driven to move up and down by a drive mechanism 46. As seen from FIG. 4. a pair of guide rails 47a, 47b are arranged along the vertical edges of the vertical base board 41 and projecting in the direction opposite to the lateral side 31a. A ball shaft 35 functioning as a male screw of a ball screw 48 is vertically and rotatably disposed between the guide rails 47a, 47b The movable support 45 is connected to the ball shaft 48 on the rear side member 49 by means of a ball nut section 50 functioning as a female screw of the ball screw and engaged with the ball shaft 48. A pair of sliders 51a, 51b are arranged on the inner wall of the rear side member 49 and slidingly engaged with the respective guide rails 47a, 47b. The rear side member 49 has a width greater than that of the vertical base board 41. A pair of arms 52a, 52b are projecting toward the lateral side 31a of the load-lock chamber 31 from the respective lateral edges of the rear side member 49. The front ends of the arms 52a, 52b are fixed to the respective lateral edges of a front side member 53.

A cap means 54 is disposed near the front ends of the arms 52a, 52b and designed to close the opening 28 by the cap means 54 when the wafer boat 39 is loaded into the process tube 22. The wafer boat 39 is placed above the cap means 54 with a substantially cylindrical heat-retaining column 55 interposed between the top of the cap means 54 and the bottom of the wafer boat 39. With such an arrangement, the wafer boat 39 is located in an evenly distributed heat area, in which the temperature are uniform at almost all positions within the process tube 22 once it is loaded into the process tube 22.

As illustrated in FIG. 5, a ball screw 61 which is in fact the combination of the ball shaft 48 and the ball nut 50 is connected to an electric motor 62 which is by turn electrically connected to a heat-treatment control unit 63. The electric motor 62 is set to operate by an output signal from the heat-treatment control unit 63 to drive the ball shaft 48 to rotate so as to move the movable support 45 up and down by a function of the ball screw 61.

Figure 6:
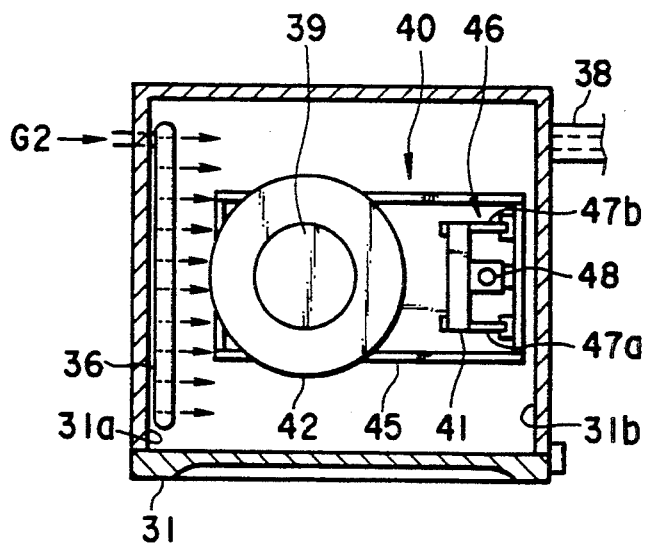
FIG. 6 is a horizontal sectional view of the loading section of the embodiment of heat-treatment apparatus of FIG. 1.

With a loading section 12 having a configuration as described above, purge gas G2 fed from the gas source by way of the gas supply pipe 37 is injected into the load-lock chamber 31 through the air holes 36a of the nozzle 36. The injected purge gas G2 or any air remaining in the load-lock chamber 31 before the start of the purging operation is forcedly evacuated from the chamber 31 through the exhaust pipe 38 by the vacuum pump. Thus, a gas flow is generated within the load-lock chamber 31 from the lateral side 31a where the nozzle 36 is disposed toward the lateral side 31b where the exhaust pipe 38 located (as indicated by an arrow in FIGS. 2 and 6)). The drive mechanism 46, on the other hand, is disposed at the rear side of the vertical base board 41 against the wafer boat 39. More specifically, the drive mechanism 46 is located downstream to the vertical base board 41 in terms of the flow of purge gas G2. Therefore, any fine particles that may be produced as a result of mechanical wear of the ball screw 61, the guide rails 47a, 47b and/or sliders 51a, 51b are promptly evacuated from the chamber 31 through the exhaust pipe 38. On the other hand, any fine particles that may be introduced toward the wafer boat 39 by the conventional current of gas within the chamber 31 are blocked by the vertical base board 41. Consequently, the particles within the chamber 31 are prevented from adhering to the surface of the wafers 21 contained in the wafer boat 39. This means that the heat-treatment is subjected to the wafers 21 under a practically particle-free condition to produce high quality LSIs.

In addition, the wafers 21 unloaded from the process tube 22 immediately after heat-treatment are as hot as approximately 150° to 250° C. and vigorously emit heat into the environment. Since, however, the vertical base board 41 is disposed between the wafer boat 39 and the drive mechanism 46, the latter is protected from being directly exposed to high temperature, meaning that the lubricant oil and other thermally susceptible materials within the drive mechanism 46 are prevented from being degraded to generate fine particles and consequently the drive mechanism 46 can enjoy a prolonged service life.

As described above, the vertical base board 41 supports the movable support 45 and the drive mechanism 46 and, at the same time, shields the drive mechanism 46 from exposure to the wafer boat 39. The vertical base board 41 is rigidly and securely fixed to the load-lock chamber 31 by means of the vertical base board 43 and the L-shaped angle joints 44. With such an arrangement, the overall structure of the boat elevator 40 can be remarkably simplified and the overall space the boat elevator 40 occupies in the load lock chamber 31 is significantly reduced if compared with conventional ones. Consequently, the load-lock chamber 31 requires less capacity and therefore the operation of evacuating the inside of the chamber 31 or purging it with gas can be carried out quickly within a reduced period of time.

It should be noted that the boat elevator 40 can be easily modified and adapted to the form and capacity of the load-lock chamber 31 by altering the height of the vertical base board 41 and/or the length of the arms 52a, 52b.

Figure 7:
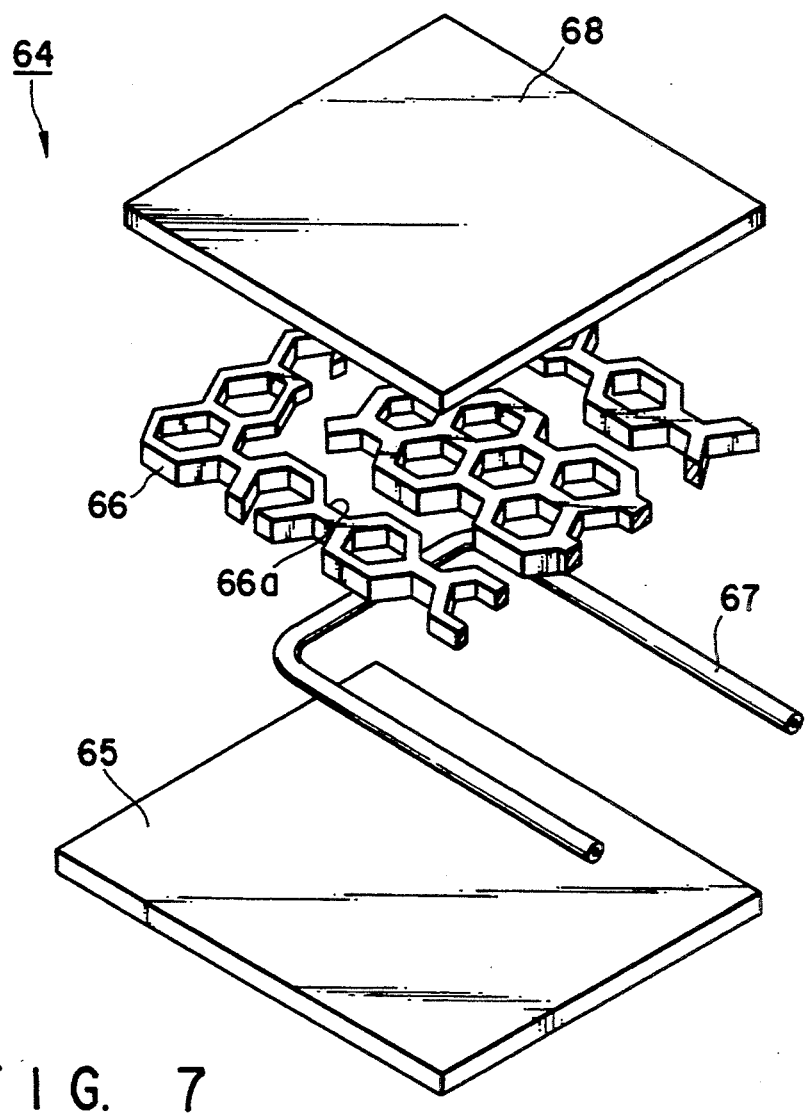
FIG. 7 is an exploded perspective view of the wall of the load-lock chamber of the embodiment of heat-treatment apparatus of FIG. 1.

It is preferable to use wall members 64 having a honeycomb structure as illustrated in FIG. 7 for the wall of the load lock chamber 31. Each of the wall members 64 is prepared in a manner as described below. First, a honeycomb member 66 is placed on the outer surface of a first plate member 65 and, thereafter, a pipe 67 is placed within a pipe containing space 66a within the honeycomb member 66. Then, a second plate member 68 is placed on the outer surface of the honeycomb member 66. The combined plate members, honeycomb member and pipe are then brazed together at high temperature (e.g., approximately 700° C.).

The first plate member 65 of each of the wall members 64 is disposed to face the interior of the load-lock chamber 31. Therefore, it is preferably made of a heat resistant material such as aluminum and stainless that hardly reacts with the process gas in the chamber 31.

The honeycomb member 66 is preferably made of a heat resistant material such as aluminium and stainless that hardly reacts with the process gas. As long as the load lock chamber 31 is hermetically sealed by the first plate members 65 of the wall members 64, it is not necessary to consider the influence of the process gas inside the chamber 31 in the case of selecting a material for the honeycomb member 66. The honeycomb structure may be replaced by a similar structure with unit cells that are not hexagonal.

The pipe containing space 66a is so configured as to conform to the shape of the pipe 67. A pump (not shown) is connected to the pipe 67 in order to cause a cooling medium such as water to run through the pipe and cool the purge gas inside the loadlock chamber 31. The smaller the thickness of the first plate 65, the higher will be the cooling effect of the cooling medium running through the pipe 67.

The second plate member 68 is preferably made of a heat resistant material such as aluminum and stainless having an excellent mechanical strength. As long as the load-lock chamber 31 is hermetically sealed by the first plate members 65, it is not necessary to consider the influence of the process gas inside the chamber 31 in the case of selecting a material for the second plate member 68.

By using wall material 64 as described above as the wall of the load-lock chamber 31, the lightening, of the weight of the load-lock chamber 31 can be achieved. In addition, the inside of the load-lock chamber 31 can be effectively and efficiently cooled by the cooling medium running through the pipes of the wall.

Figure 8:
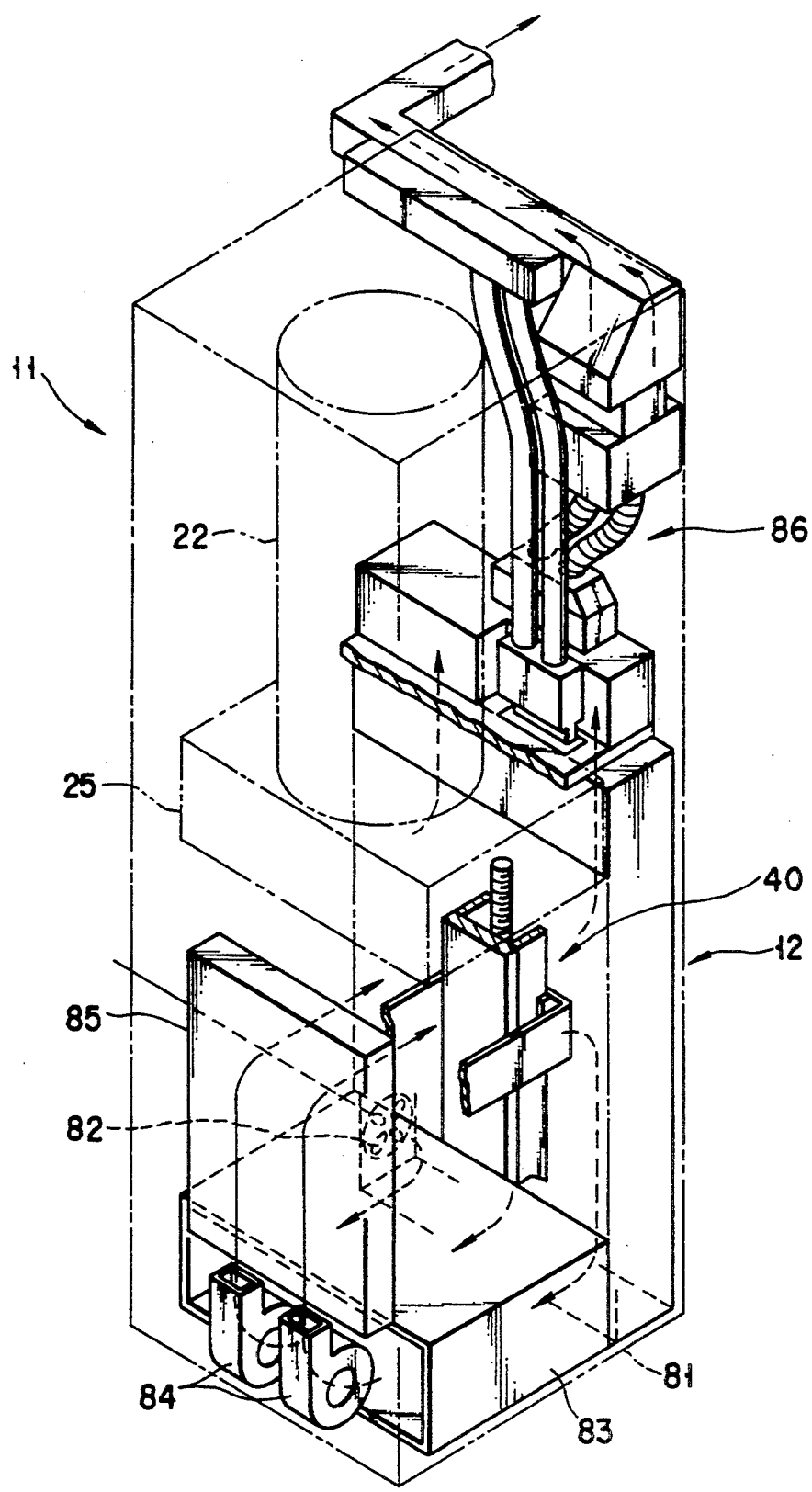
FIG. 8 a schematic perspective view of a modified loading section of the embodiment of heat-treatment apparatus.

While the loading section 12 having the load-lock chamber 31 has been described above, it may alternatively be devoid of the load lock chamber 31 as illustrated in FIG. 8. Referring now to FIG. 8, a process tube 22, a manifold 25 and a loading section 12' are vertically and serially arranged within a box 81. A fan 82 is disposed at a given position of the bottom of the box 81 to draw cleaning air into it. The drawn cleaning air then passes through a duct 83 laid on the bottom of the box 81 and is blown up by blower units 84 disposed near the bottom of the lateral side 81b opposite to the lateral side 81a where the fan is disposed. As shown in FIG. 9, the blown up cleaning air is then caused to pass through a filter 85 and be blown out from the filter 85 toward the lateral side 81a. The used cleaning air is then let out by an exhaust system 86 disposed adjacent to the process tube 22.

A boat elevator 40 is arranged inside the loading section 12 which is configured in a manner as described above. More specifically, as shown in FIG. 9, a vertical base board 41 is disposed above the duct 83 along the lateral side 81a and separated from the lateral side 81a by a given distance. A drive mechanism 46 is fixed to the major surface of the vertical base board 41 faced to the lateral side 81a. A movable support 45 having a configuration as described earlier by referring to the first embodiment is vertically movably attached to the vertical base board 41.

With an arrangement of components as described above, a flow of cleaning air is generated inside the loading section 12 of the box 81, running from the lateral side 81b toward the lateral side 81a (as indicated by arrows in FIG. 9). On the other hand, the drive mechanism 46 is located behind the vertical base board 41 with regard to the wafer boat 39. In other words, the drive mechanism 46 is disposed downstream to the vertical base boat 41 along the flow of cleaning air. Therefore, any fine particles that may be produced as a result of mechanical wear in the drive mechanism 46 are promptly evacuated from the box 81 by the exhaust system 86. On the other hand, any fine particles that may be driven toward the wafer boat 39 by the convectional current of gas within the chamber 31 are blocked by the vertical base boat 41. Consequently, the particles are prevented from adhering to the surface of the wafers Although, the wafers 21 and the wafer boat 39 un-loaded 10 from the process tube 22 immediately after heat-treatment emit heat into the environment, the emitted heat is blocked by the vertical base board 41 and, therefore, the drive mechanism 46 is protected from being directly exposed to high temperature.

Thirdly, referring to FIG. 10, the wafer transfer section 13 comprises a pair of heat-treatment sections 11 and a robot chamber 95 connected to a pair of loading sections 12 and a pair of wafer stocker sections 14 by way of respective pairs of gate valves 91, 92 and 93, 94. As illustrated in FIG. 2, the robot chamber 95 is provided at respective locations with a gas supply pipe 96 through which purge gas G3 is fed in and a exhaust pipe 97 through which the used purge gas G3 is drawn out. The gas supply pipe 96 is connected to a gas source (not shown). It should be noted that the number of heat-treatment sections 11, that of loading sections 12 and that of wafer stocker sections 14 do not have to necessarily be equal to two and may alternatively be smaller or greater than two.

In the robot chamber 95, a transfer robot 98, an orientation flat aligner 99 (hereinafter referred to as OFA), a pre-buffer stage 100 and a post buffer stage 101 are arranged. The base of the transfer robot 98 is disposed on an XYZ stage. The transfer robot 98 is provided with a multiarticular manipulator arm 98a comprising an expandable link mechanism. The multiarticular manipulator arm 98a is equipped at the front end with a wafer holder 98b that can hold a wafer 21 at a time.

The OFA 99 is located substantially in front of the transfer robot 98. The OFA 99 is typically provided with a wafer placement stage 99a that places a wafer 21 on it and, at the same time, freely rotate and a light sensor (not shown) which detects if the orientation flat 21a of the wafer 21 on the wafer placement stage 99a is aligned with a given direction and, if not, causes the wafer placement stage 99a to rotate until the orientation flat 21 is aligned with that given direction. The wafer placement stage 99a can be equipped with means for horizontally moving the wafer 21 placed on it along the X- and Y-axes in order to appropriately adjust the center axis of the wafer 21 at a predetermined position.

The transfer robot 98 and the OFA 99 are operated by output signals of the heat-treatment control unit 63.

The pre-buffer stage 100 and the post-buffer stage 101 are symmetrically arranged relative to the OFA 99, the pre-buffer stage 100 being disposed on the side of the wafer stocker sections 14, the post buffer stage 101 being disposed on the side of the load-lock chamber 31. The pre-buffer stage 100 and the post-buffer stage 101 are provided with respective wafer placement stages 100a, 101a for placing wafers 21 on them.

The wafer stocker section 14 comprises a cassette chamber 102. A plurality of cassette stages (not shown) are longitudinally arranged within the cassette chamber 102. These cassette stages are moved up and down inside the cassette chamber 102 by means of an elevator mechanism (not shown). The cassette stages 102 carry respective wafer cassettes 103. A plurality of wafers 21 are arranged with their major surfaces facing those of the adjacent ones and separated from the adjacent wafers by a predetermined distance in each of the wafer cassettes 103. Wafer cassettes 103 are carried by the respective cassette stages in such a manner that the wafers contained therein are substantially horizontally disposed. The cassette chamber 102 is provided on its front side with a door 104 through which wafer cassettes 103 are moved in and out.

If necessary, any air remaining in the wafer chamber 102 can be evacuated to vacuum or the inside of the chamber can be purged typically by $N_2$ gas.

The gate valves 91, 92 and 93, 94 connecting the wafer transfer chamber 95 and the load-lock chamber 31 and the cassette chamber 102 respectively can be closed or opened by an output signal transmitted from the heat-treatment control unit 63.

Figure 11:
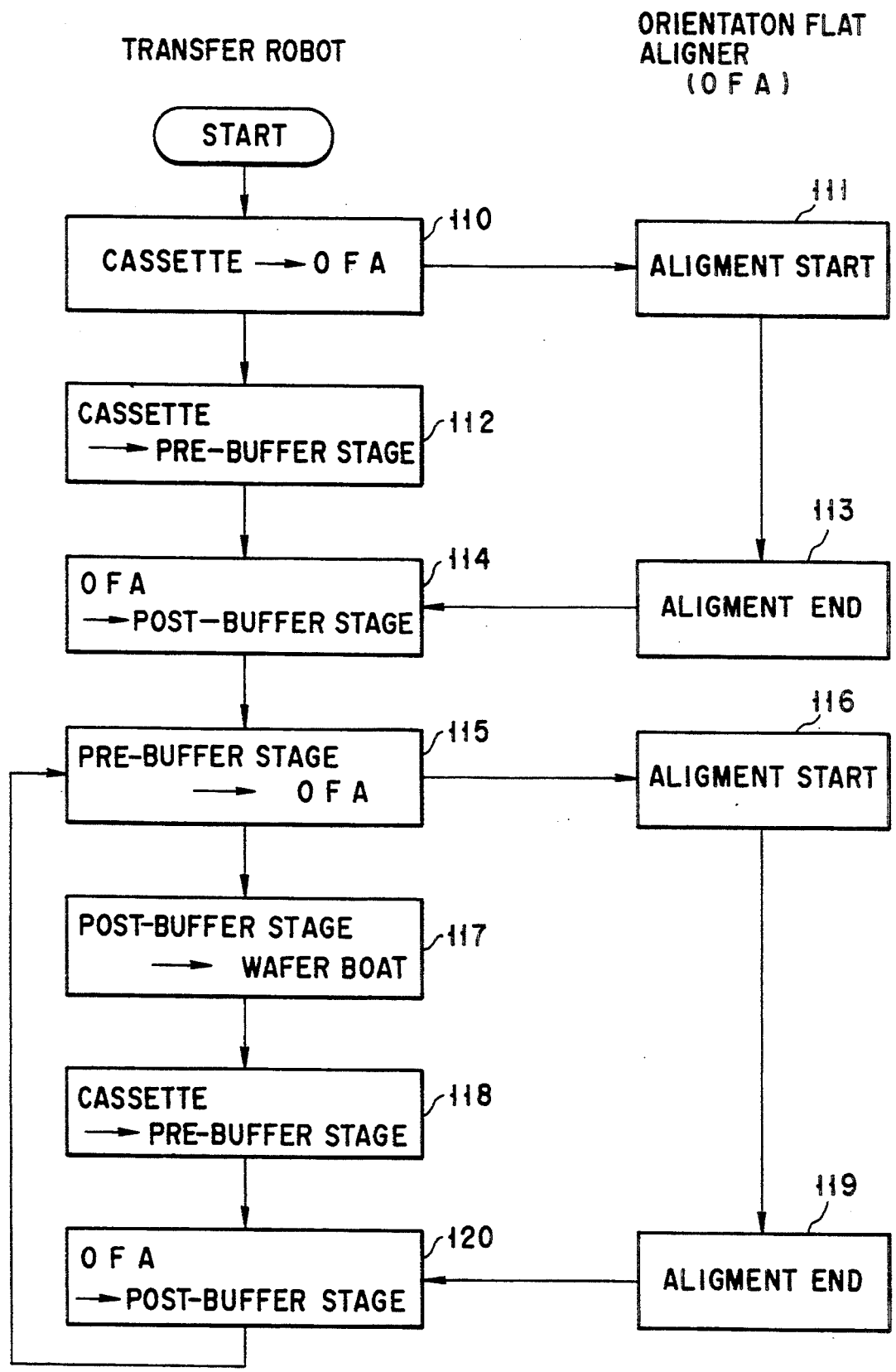
FIG. 11 is a flow chart illustrating how the operation of transferring wafers is conducted in a heat-treatment apparatus according to the invention; and 10

Referring to the flow chart of FIG. 11, wafers 21 are transferred from wafer cassettes 103 to the wafer boat 39 and the orientation flats of wafers 21 are aligned in the wafer transfer section 13 in the following steps.

(1) The transfer robot 98 takes out a wafer 21 from a wafer cassette 103 and places it on the wafer placement stage 99a of the OFA 99 (110).

(2) The OFA 99 starts an operation of aligning the orientation flat of the wafer 21 (111).

(3) while the operation of aligning the orientation flat is being carried out, the transfer robot 98 takes out another wafer 21 from the wafer cassette 103 and places it on the wafer placement stage 100a of the pre-buffer stage 100 (112).

(4) Upon completion of the operation of aligning the orientation flat (113), the transfer robot 98 moves the wafer 21 whose orientation flat has been aligned from the OFA 99 onto the wafer placement stage 101a of the post buffer stage 101 (114).

(5) The transfer robot 98 moves the wafer 21 on the pre-buffer stage 100 onto the OFA 99 (115).

(6) The OFA 99 starts an operation of aligning the orientation flat of the wafer 21 (116).

(7) While the operation of aligning the orientation flat is being carried out, the transfer robot 98 moves the wafer 21 on the post-buffer stage 101 into the wafer boat 39 (117).

(8) The transfer robot 98 takes out still another wafer 21 from the wafer cassette 103 and places it on the wafer placement stage 100a of the pre-buffer stage 100 (118).

(9) Upon completion of the operation of aligning the orientation flat (119), the transfer robot 98 moves the wafer 21 whose orientation flat has been aligned from the OFA 99 onto the wafer placement stage 101a of the post-buffer stage 101 (120).

Thereafter, the steps (5) through (9) are repeated for a number of times until a given number of wafers 21 are transferred onto the wafer boat 39. The orientation flats 21a of the transferred wafers 21 are now completely aligned with a given direction. Since the operation of aligning orientation flats takes place concurrently with that of transferring wafers 21, the overall time requirement will be significantly reduced. Since an orientation flat aligning operation normally takes approximately 15 seconds, the transfer robot 98 of a wafer transfer system not provided with buffer stages remains idle for that period of time. Additionally, since a wafer cassette 103 is loaded with a plurality of wafers 21 stacked in it with only a short distance provided between any two adjacent wafers, it is necessary for the transfer robot 98 to keep its wafer holder 98b away from wafers 21 other than the one currently being handled. Still additionally, since wafers 21 are moved by way of the gate valve 91, care should be taken not to make them touch the gate valve 91. For these reasons, it normally takes approximately 5 seconds for a wafer to be moved from a wafer cassette 103 to the OFA. 99. For similar reasons, it also normally takes approximately 5 seconds for a wafer to be moved from the OFA 99 to the wafer boat 39.

Contrary to this, in the wafer transfer section 13 of the above described embodiment, the wafer robot 98 carries out an operation of placing a second wafer 21 on the pre-buffer stage 100 while the OFA 99 performs alignment of the orientation flat of a wafer 21 (step 2). The operations of the moving the second wafer 21 (step 3) take approximately 5 seconds. However, the operation of moving the second wafer 21 from the pre-buffer stage 100 onto the OFA 99 (step 5) takes only 1 second because only that second wafer 21 is placed on the pre-buffer stage 100, around which no obstacles are found, and the pre-buffer stage 100 is located relatively close to the OFA 99. Similarly, while an orientation flat aligning operation is carried out on the second wafer 21, the first wafer 21 that has undergone an orientation flat aligning operation is moved from the post-buffer stage 101 onto the wafer boat 39 (step 7) and a third wafer 21 is placed on the pre-buffer stage 100 (step 8). Thus, a series of operations conducted on a wafer 21 must be required and normally take approximately 60 seconds with a conventional wafer transfer system not provided with buffer stages. However, the series of operation will now require only approximately 45 seconds by the wafer transfer system of the embodiment having a configuration as described above. As a wafer boat 39 normally contains 50 to 100 wafers 21, the time required for transferring a whole batch of wafers to a wafer boat 39 can be remarkably reduced by such a transfer system. It may be clear that a wafer transfer system which is not provided with a pre-buffer stage 100 or a post-buffer system 101 can also remarkably reduce the time required for the same operations.

The mode of arrangement of the OFA 99, pre-buffer stage 100 and post-buffer stage 101 in the robot chamber 95 is not limited to the one described above, although it is preferred that the wafer boat 39 and the wafer cassette 103 are preferably arranged close to each other to reduced the distance of transfer of a wafer 21.

If preferable, a plurality of pre-buffer stages 100 and/or a plurality of post-buffer stages 101 may be provided for a single OFA 99. Similarly, two or more than two OFAs 99 may be provided in a single robot changer 95 to further reduce the time requirement for transfer operations.

While a wafer transfer system is described above in terms of a wafer cassette 103 and a wafer boat 39, a similar wafer transfer system may be installed between a preceding heat-treatment section and a succeeding heat-treatment section so that wafers may be unloaded from the preceding heat-treatment section and moved to the succeeding heat-treatment section while their orientation flats are being aligned. More specifically, such a wafer transfer system may be installed between a wafer oxidizing unit and a CVD unit.

In below, the gas supply/exhaust system as well as the systems for controlling them of the above embodiment will be described.

In the above embodiment of heat-treatment apparatus 10, the internal pressure (hereinafter referred to as P1) of the load lock chamber 31 is preferably made lower than the internal pressure (hereinafter referred to as P2) of the robot chamber 95. Then, when the gate valves 91, 92 are opened to allow transfer of wafers from the wafer boat 39 and a wafer cassette 103, the purge gas contained in the robot chamber 95 tends to flow into the load-lock chamber 31.

The difference of the internal gas pressures (hereinafter referred to as $\Delta P$) of the load-lock chamber 31 and the robot chamber 95 needs to take a value that effectively induces a flow of purge gas from the robot chamber 95 to the load-lock chamber 31. On the other hand, the area of the opening of the gate valves 91 and that of the gate valve 92 need to be sufficiently small to maintain the difference of the pressures $\Delta P$ and, at the same time, sufficiently large to allow free and unobstructed transfer of a wafer into and out of the load-lock chamber 31 respectively.

Figure 12:
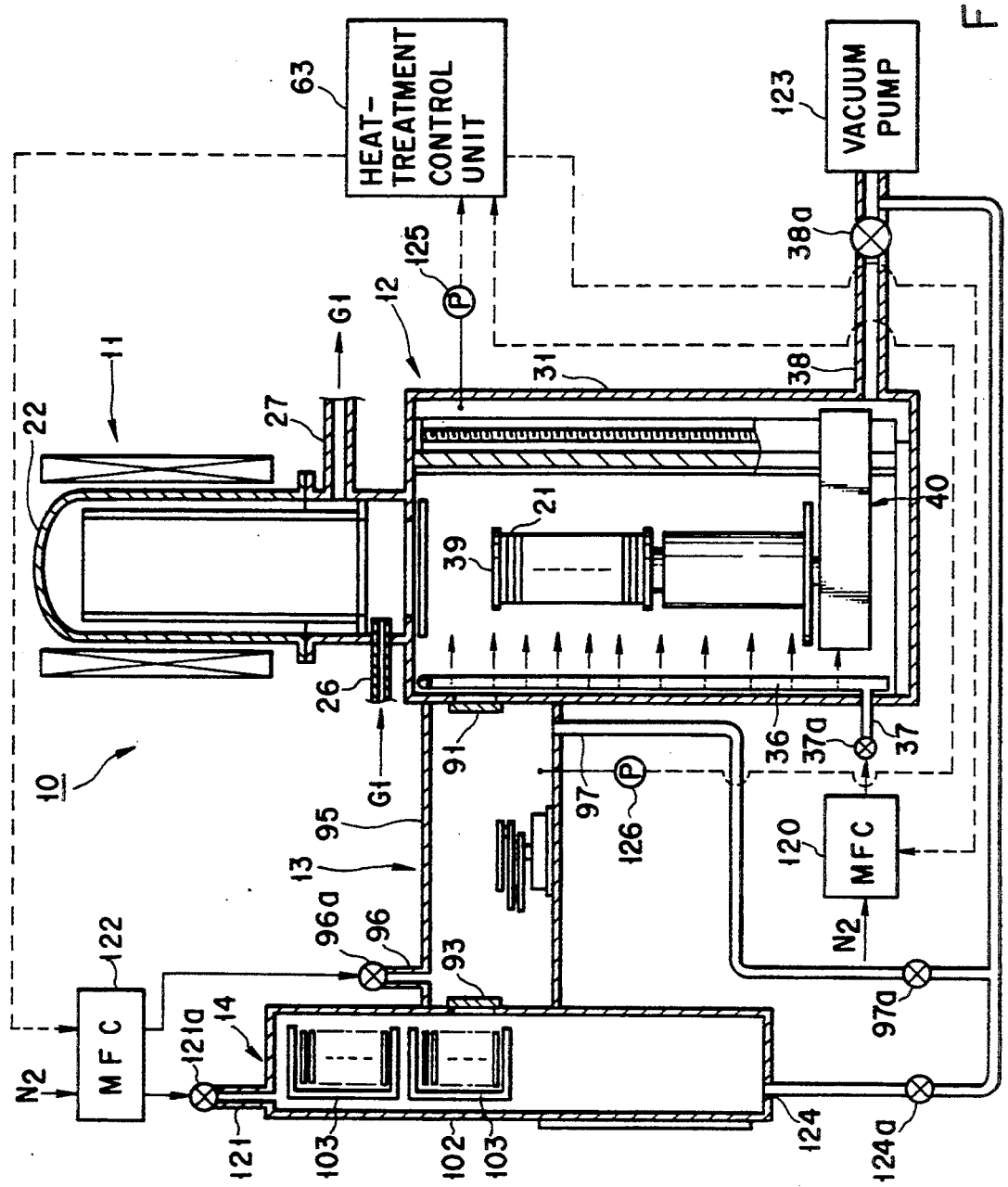
FIG. 12 is a schematic illustration of the gas supply/exhaust mechanism of a heat-treatment apparatus according to the invention.

Finally, the system of controlling the gas pressure of the heat-treatment apparatus 10 will be described in detail by referring to FIG. 12.

A first mass flow controller (MFC) 120 is connected to the nozzle 36 disposed in the load-lock chamber 31 by way of a gas supply pipe 37 and a valve 37a. The first mass flow controller 120 is connected to an $N_2$ gas source (not shown).

A second mass flow controller 122 is connected to the robot chamber 95 and the cassette chamber 102 by way of gas supply pipes 96, 121 and valves 96a, 121a. The second mass flow controller 122 is also connected to the $N_2$ gas source.

On the other hand, a vacuum pump 123 is connected to the exhaust pipe 38 disposed in the load-lock chamber 31 by way of a valve 38a. The vacuum pump 123 is also connected to the exhaust pipe 97 disposed in the robot chamber 95 by way of a valve 97a. The exhaust pipe 124 disposed in the cassette chamber 102 joins the exhaust pipe 97 by way of a valve 124a.

The load-lock chamber 31 and the robot chamber 95 are provided with respective gas pressure gauges 125, 126. The readings of the gas pressure gauges 125,126 are transmitted to the heat-treatment control unit 63. On the other hand, control signals are output by the heat-treatment control unit 63 to the first and second mass flow controllers 120, 122.

With a control system having a configuration as described above, $N_2$ gas is supplied to the load-lock chamber 31 at a given rate under the control of the first mass flow controller 120 and to the robot chamber 95 and the cassette chamber 102 at respective give rate under the control of the second mass flow controller 122. The $N_2$ gas in the chambers 31, 95, 102 is forcedly evacuated by the vacuum chamber 123 after having circulated in those chambers.

The internal gas pressure P1 of the load-lock chamber 31 and the internal gas pressure P2 of the robot chamber 95 are usually detected respectively by the gas pressure gauges 125, 126. Then, the heat-treatment control unit 63 controls the first and second mass flow controllers 120, 122 according to the results detected with the gauges so that the difference of the gas pressures $\Delta P$ is maintained to a given level by changing if necessary, the rates of the $N_2$ gas flows running into the chambers 31, 95, 102 respectively. Consequently, there always is a flow of $N_2$ gas running from the robot chamber 31 into the load-lock chamber 31 to prevent any process gas remaining in the load-lock chamber 31 from flowing into the robot chamber 95. In other words, the process gas G1 in the process tube 22 is partly allowed to flow into the load-lock chamber 31 when the wafer boat 39 is loaded into or un-loaded from the process tube 22. Although the process gas G1 in the load-lock chamber 31 is forcedly evacuated from it with purge gas G2 by the vacuum pump 123 by way of the exhaust pipe 38, part of the process gas G1 tends to remain in the loadlock chamber 31. With a gas supply/exhaust system and a control system as described above, however, since there is no flow of $N_2$ purge gas running from the robot chamber 95 toward the load-lock chamber 31, the process gas G1 is prevented from entering the robot chamber 95. Thus, undesirable occurrences of chemical reactions of process gas G1 and wafers 21 in the robot chamber 95 that can adversely affect the quality of the semiconductor devices treated there to reduce the yield of a manufacture can be effectively prevented. Additionally, since the wafer transfer system including the transfer robot 98 are protected from adverse effects of process gas G1, the service life of the transfer robot 98 and other components of the system can be significantly prolonged.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A heat-treatment apparatus comprising:
   a heat-treatment section for subjecting a heat-treatment to an object of treatment in a predetermined manner; and
   a loading section for loading said object of treatment into and unloading it from said heat-treatment section;
   said loading section including:
     a support member for supporting said object of treatment;
     a drive mechanism for loading said object of treatment; into and unloading it from said heat-treatment section; and
     a board member disposed between said support member and said drive mechanism to shield said drive mechanism against an area where said object of treatment is moved by the loading section, said board member having first major surface facing the area where said object is moved, and a second major surface opposite to said first major surface and to which said surface mechanism is attached;

wherein said loading section is further provided with a load-lock chamber for maintaining an inside in vacuum or in an atmosphere of a given gas, which is connected to said heat-treatment section and contains in it said support member, said drive mechanism and said board member, said loading section further including gas supply means for supplying a desired gas into said load-lock chamber and exhaust means for discharging a gas which is presented in the load-lock chamber from said load-lock chamber to product a given gas flow in the loading section.

2. A heat-treatment apparatus according to claim 1, wherein said loading section further includes gas supply means for supplying a desired gas into the loading section and exhaust means for discharging a gas which is presented in the loading section to produce a given gas flow in the loading section.

3. A heat-treatment apparatus according to claim 2, wherein said drive mechanism is arranged downstream of the gas flow relative to the board 4. A heat-treatment apparatus according to claim 1, wherein said drive mechanism is arranged downstream of the gas flow relative to the board member.

5. A heat-treatment apparatus according to claim 1, wherein the drive mechanism comprises a ball screw including a ball shaft and a ball nut section, and a motor for driving the ball shaft of said ball screw to rotate.

6. A heat-treatment apparatus according to claim 1, wherein a pair of opposite ends of the board member are securely and rigidly fixed to an inner wall of the load-lock chamber by means of holding members.

7. A heat-treatment apparatus according to claim 1, wherein he wall material of the load-lock chamber comprises honeycombs.

8. A heat-treatment apparatus according to claim 1 wherein said support member comprises supporting means which supports said object of treatment.

9. A heat-treatment apparatus according to claim 5, wherein said ball shaft is rotatably attached to the second major surface of said board member; and said drive mechanism further comprises:

a rear side member connected to said ball shaft via said ball nut section, and having a width greater than a width of said board member; and a pair of arms extending from end portions of said rear side member toward the first major surface of said board member, and said support member being attached to distal ends of said arms.

* * * * *